US011136661B2

(12) United States Patent
Lv et al.

(10) Patent No.: US 11,136,661 B2
(45) Date of Patent: Oct. 5, 2021

(54) MASK PLATE FRAME, MASK PLATE AND EVAPORATION APPARATUS

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Shouhua Lv, Beijing (CN); Chunchieh Huang, Beijing (CN); Baojun Li, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 225 days.

(21) Appl. No.: 16/054,773

(22) Filed: Aug. 3, 2018

(65) Prior Publication Data

US 2019/0203335 A1 Jul. 4, 2019

(30) Foreign Application Priority Data

Jan. 2, 2018 (CN) ........................ 201820002531.8

(51) Int. Cl.

| | |
|---|---|
| ***C23C 14/04*** | (2006.01) |
| ***C23C 14/12*** | (2006.01) |
| ***C23C 14/22*** | (2006.01) |
| ***H01L 51/00*** | (2006.01) |
| ***H01L 51/56*** | (2006.01) |

(52) U.S. Cl.

CPC ............ *C23C 14/042* (2013.01); *C23C 14/12* (2013.01); *C23C 14/22* (2013.01); *H01L 51/0011* (2013.01); *H01L 51/56* (2013.01)

(58) Field of Classification Search

CPC ..... C23C 4/0005; C23C 14/04; C23C 14/042; C23C 14/044; C23C 16/04; C23C 16/042; C30B 25/04; H01L 51/0011; H01L 51/56

See application file for complete search history.

(56) References Cited

U.S. PATENT DOCUMENTS

| | | | | | |
|---|---|---|---|---|---|
| 2006/0011137 | A1* | 1/2006 | Keller | C23C 16/042 | 118/720 |
| 2009/0137180 | A1* | 5/2009 | Sung | C23C 14/042 | 445/60 |
| 2012/0234235 | A1* | 9/2012 | Lee | C23C 16/042 | 118/504 |
| 2014/0130735 | A1* | 5/2014 | Kim | C23C 14/042 | 118/504 |
| 2014/0158044 | A1* | 6/2014 | Han | B05C 21/005 | 118/504 |
| 2015/0007767 | A1* | 1/2015 | Ko | B05C 21/005 | 118/504 |
| 2015/0041793 | A1* | 2/2015 | Chan | H01L 51/56 | 257/40 |
| 2015/0101536 | A1* | 4/2015 | Han | C23C 14/042 | 118/721 |

(Continued)

*Primary Examiner* — Aiden Lee

(74) *Attorney, Agent, or Firm* — Brooks Kushman P.C.

(57) ABSTRACT

The present disclosure provides a mask plate frame. The mask plate frame includes two opposite rims, and a plurality of connectors detachably mounted to a first surface of each rim along a length direction of each rim. Each connector is used to mount a mask strip.

15 Claims, 3 Drawing Sheets

20
112
12
26

(56) References Cited

U.S. PATENT DOCUMENTS

2016/0359145 A1* 12/2016 Kuang .................... H01L 51/56
2017/0001259 A1* 1/2017 Han ..................... B23K 26/037
2017/0282212 A1* 10/2017 Kang .................... B05C 21/005

* cited by examiner

MASK PLATE FRAME, MASK PLATE AND EVAPORATION APPARATUS

CROSS-REFERENCE TO RELATED APPLICATION

This application claims priority to Chinese Patent Application No. 201820002531.8, filed on Jan. 2, 2018, which is incorporated herein by reference in its entirety.

TECHNICAL FIELD

The present disclosure relates to the field of evaporation technology, and in particular to a mask plate frame, a mask plate and an evaporation apparatus.

BACKGROUND

In the organic evaporation coating technology for organic light-emitting diodes (OLED) in the related art, a high-precision metal mask plate is taken as a mold, and organic material is evaporated at high temperature. Then, evaporated organic material in the molecular state passes through effective openings of the mask plate and is coated at openings of a transparent conductive film (ITO) of a backboard glass, thereby realizing organic luminescence.

The mask plate includes a frame and a metal mask strip. Two ends of the mask strip are welded to two opposite rims of the frame, respectively. When the mask strip is damaged and is required to be replaced with a new mask strip, it is needed to remove away the damaged mask strip before welding the new mask strip, and it is necessary to polish residual solder joints and the remaining mask strip on a surface of the frame. Due to repeated welding of mask strips, the welded surface is constantly polished, which results in problems such that the frame gets thinner and flatness is poor, thereby affecting service life.

SUMMARY

One embodiment of the present disclosure provides a mask plate frame which includes two opposite rims and a plurality of connectors detachably mounted to a first surface of each rim along a length direction of each rim. Each connector is configured to mount a mask strip.

Optionally, each rim includes a slot defined in the first surface of each rim; the connectors mounted to each rim are snapped in the slot of each rim.

Optionally, the slot of each rim is a strip slot that extends along the length direction of each rim; each rim further includes a plurality of stoppers; each of the stoppers of each rim is detachably mounted to one position selected from different positions of the slot of each rim along the length direction of each frame; the stoppers of each rim limit positions of the connectors mounted to each rim in the length direction of each rim.

Optionally, each rim further includes a plurality of limiting grooves defined in the slot of each rim, and the limiting grooves are arranged along the length direction of each rim and are spaced from each other; each stopper includes a limiting block that is detachably mounted to one limiting groove selected from the limiting grooves of each rim; a thickness of the limiting block of each stopper in a depth direction of the slot of each rim is greater than a depth of the slot of each rim; and a limiting space is defined between every adjacent two limiting blocks and between a slot wall of the slot of each rim and the limiting block adjacent the slot wall.

Optionally, each rim further includes a second surface, and the first surface and the second surface are two opposite surfaces of each rim; one portion of a slot bottom of the slot of each rim is depressed in a direction towards the second surface of each rim to define one limiting groove of each rim; and each limiting groove of each rim extends through two opposite sides of the slot of each rim.

Optionally, each connector mounted to each rim is a connecting block that is snapped in the slot of each rim; a thickness of the connecting block in the depth direction of the slot of each rim is greater than a depth of the slot of each rim.

Optionally, the connecting block has a first connecting surface for mounting the mask strip; the first connecting surface has a first height relative to the first surface of each rim in a direction perpendicular to the first surface of each rim; along the length direction of each rim, the first height of the connecting block is gradually reduced from a middle of each rim towards two ends of each rim.

Optionally, the connecting block has a second connecting surface for mounting a shielding strip; the second connecting surface has a second height relative to the first surface of each rim in the direction perpendicular to the first surface of each rim; and the first height is greater than the second height.

One embodiment of the present disclosure further provides a mask plate which includes a mask body including a plurality of mask strips and a mask plate frame. The mask plate frame includes two opposite rims, and a plurality of connectors detachably mounted to a first surface of each rim along a length direction of each rim. One end of each strip is mounted to one of the connectors mounted to one of the two rims, and the other end of each strip is mounted to one of the connectors mounted to the other one of the two rims.

Optionally, the mask body further includes a shielding strip disposed between adjacent two mask strips; and edges of the shielding strip overlap with edges of adjacent two mask strips in the direction perpendicular to the first surface.

Optionally, one end of each strip is welded to one of the connectors mounted to one of the two rims, and the other end of each strip is welded to one of the connectors mounted to the other one of the two rims.

One embodiment of the present disclosure further provides an evaporation apparatus including the above mask plate.

BRIEF DESCRIPTION OF THE DRAWINGS

A brief introduction will be given hereinafter to the accompanying drawings which will be used in the description of the embodiments in order to explain the embodiments of the present disclosure more clearly. Apparently, the drawings in the description below are merely for illustrating some embodiments of the present disclosure. Those skilled in the art may obtain other drawings according to these drawings without paying any creative labor.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The following description of exemplary embodiments is merely used to illustrate the present disclosure and is not to be construed as limiting the present disclosure.

Figure 1:
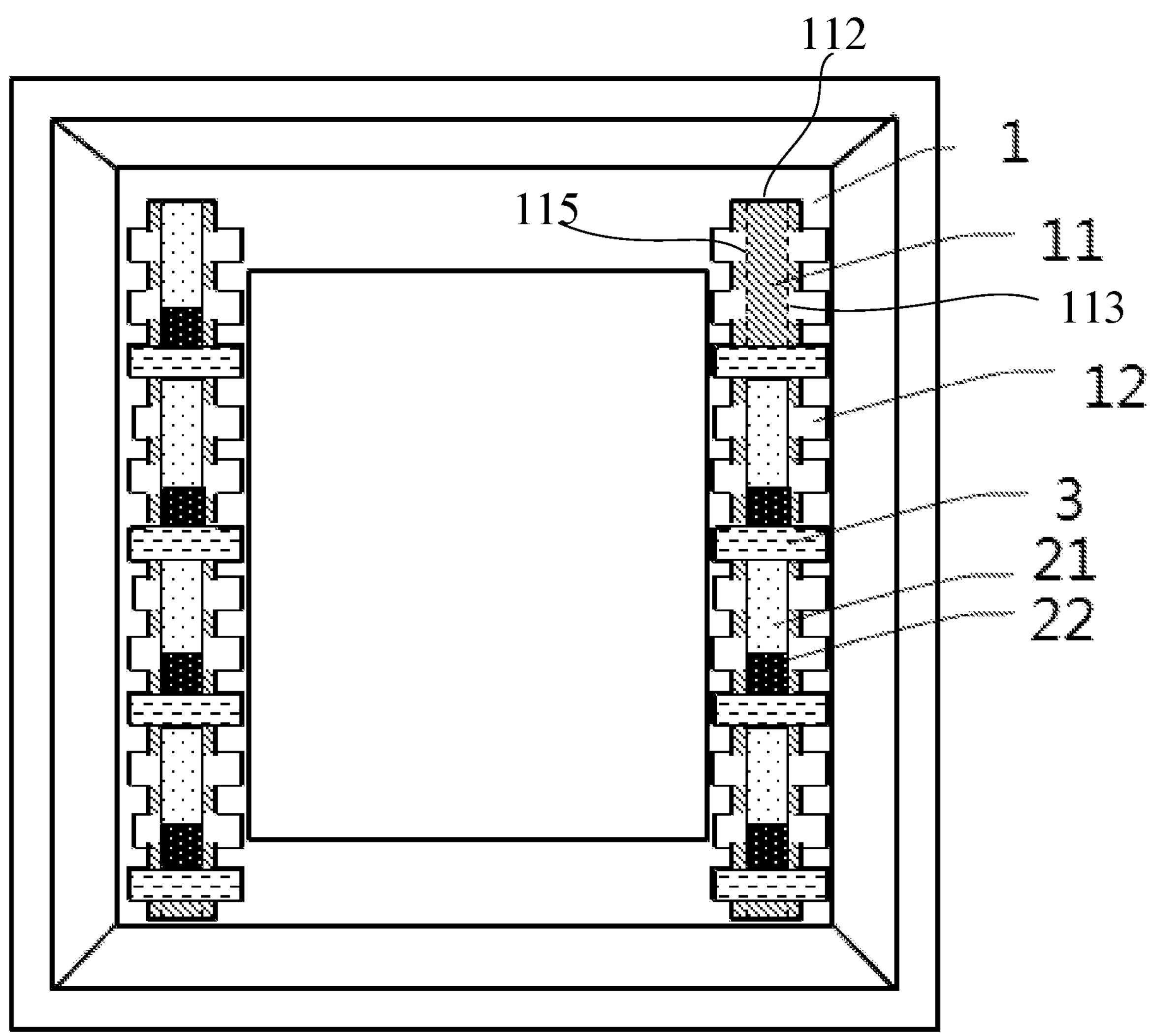
FIG. 1 is a schematic view of a mask plate frame according to some embodiments of the present disclosure.
Figure 2:
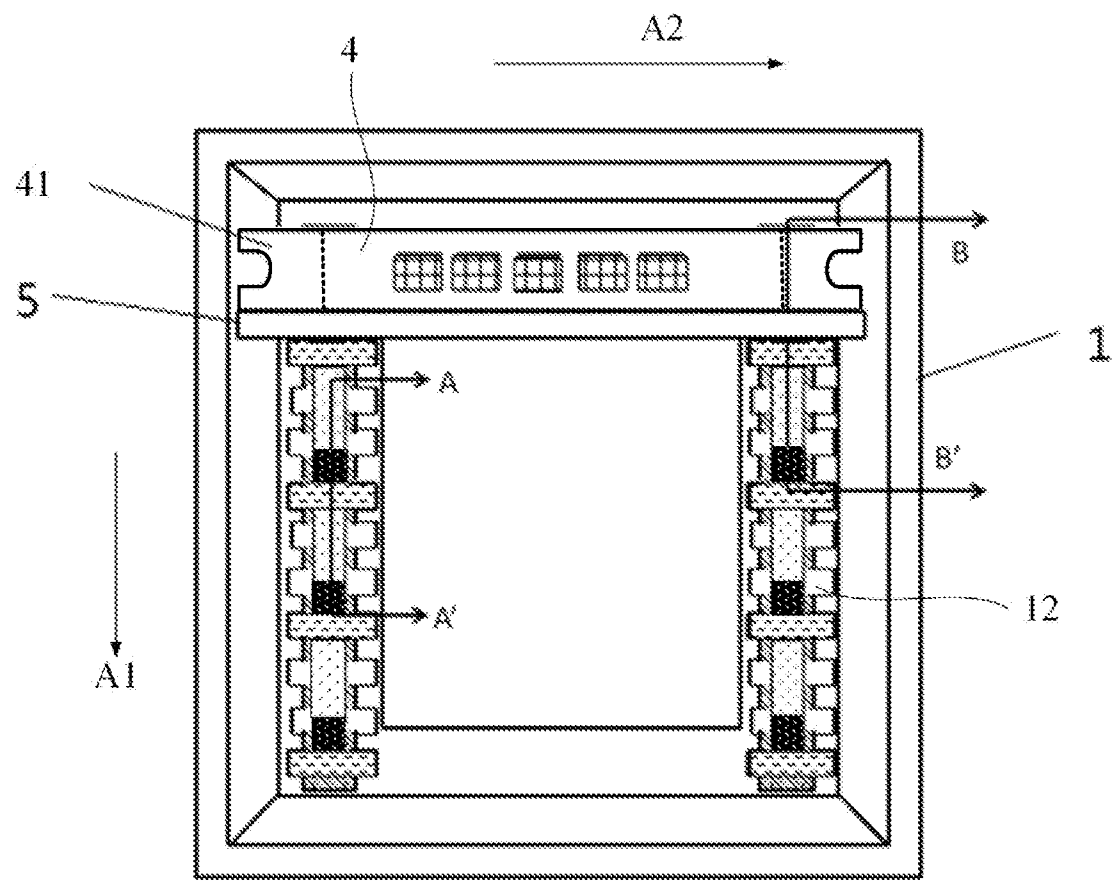
FIG. 2 is a schematic view showing the mask plate frame assembled with a mask plate according to some embodiments of the present disclosure.
Figure 3:
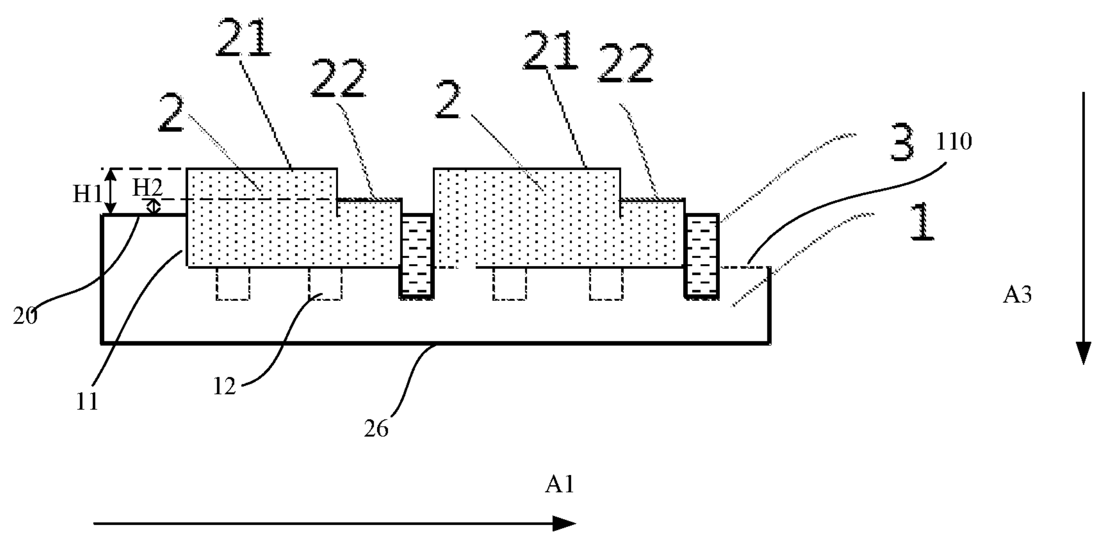
FIG. 3 is a schematic partial section view of FIG. 2 taken along the A-A' direction.

As shown in FIG. 1 to FIG. 4, some embodiments of the present disclosure provide a mask plate frame for mounting a mask body. The mask body includes a plurality of mask strips 4 each with an opening pattern. The mask plate frame includes at least two opposite rims 1. The rim 1 includes a first surface 20 for mounting the mask body. Several connectors 2 are detachably mounted to the first surface 20 and are arranged along a length direction (i.e., a first direction indicated with an arrow A1 shown in FIG. 2) of the rim 1. The connector 2 is used to fixedly mount an end portion of the mask strip 4. In one embodiment as shown in FIG. 2 and FIG. 3, the connector 2 is detachably mounted to the first surface 20, and an end portion 41 of the mask strip 4 in a second direction A2 is welded to the connector 2, thereby enabling the end portion 41 of the mask strip 4 in the second direction A2 to be detachably mounted to the rim 1 by means of the connector 2.

The presence of the connector 2 enables the end portion 41 of the mask strip 4 in the second direction A2 to be detachably mounted to the rim 1 by means of the connector 2. Thus, when replacing the mask strip 4, it is only needed to remove the connector 2 away from the rim 1, without performing operations that damage the rim, such as polishing the surface of the rim 1, thereby extending the service life of the mask plate frame.

The connector 2 may be mounted to the rim 1 in a variety of ways, as long as the connector 2 is detachably mounted to the rim 1. In some embodiments of the present disclosure, a slot 11 is defined in the first surface 20 of the rim 1, and the connector 2 is snapped in the slot 11. A length of the connector 2 in the length direction of the rim matches a width of the mask strip 4. In other words, the connector 2 of one type corresponds to the mask strip 4 of one type. When the width of the mask strip 4 changes, the corresponding connector 2 is used without performing operations that damage the rim, such as polishing the surface of the rim 1, thereby extending the service life of the mask plate frame.

In some embodiments of the present disclosure, the slot 11 is a strip slot that extends along the length direction of the rim 1. The connector 2 is capable of being snapped into different positions of the slot 11. For example, several stoppers 3 may be mounted in the slot 11 along a length direction (which is parallel to a direction indicated by the arrow A1 shown in FIG. 3) of the slot 11. The stopper 3 can limit a position of the connector 2. The stopper 3 is movably mounted in the slot 11, and may be mounted at different positions of the slot 11.

In the related art, the mask strip of the mask plate is directly welded to the surface of the rim. But the mask strips in the mask plates of different types have different widths, and are welded to different positions of the rims. Thus, the mask plate of one type can be connected to only one type of the mask strip with a certain width, and the mask strips of different widths cannot share the same mask plate frame, resulting in increased cost.

In some embodiments of the present disclosure, the stopper 3 may be mounted to different positions of the slot 11, and the position of the stopper 3 in the slot 11 may be adjusted for the mask strips 4 of different widths. Thus, the connector 2 of a corresponding a length in the length direction of the slot 11 may be used, so that the mask strips 4 of different widths can share the same mask plate frame, thereby reducing costs.

Figure 4:
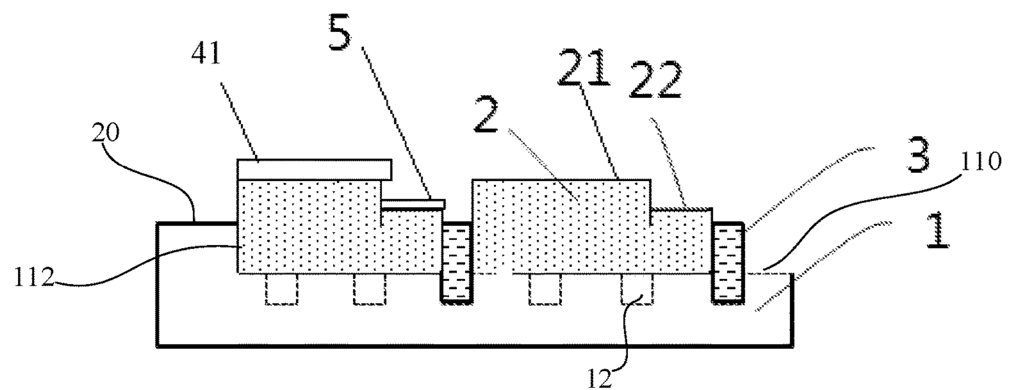
FIG. 4 is a schematic partial section view of FIG. 2 taken along the B-B' direction.

The specific structure of the stopper 3 and the specific connection mode between the stopper 3 and the slot may be varied, as long as the stopper 3 can limit the position of the connector 2 and the stopper 3 may be mounted at different positions of the slot 11. In some embodiments of the present disclosure, as shown in FIG. 3 and FIG. 4, several limiting grooves 12 are defined in the slot 11 along the length direction of the slot 11 and are spaced from each other. The stopper 3 includes a limiting block that is detachably mounted in one limiting groove 12. At least one part of the limiting block protrudes from a slot bottom 110. In other words, a thickness of the limiting block in a depth direction (which is parallel to a direction indicated by the arrow A3 shown in FIG. 3) of the slot 11 is greater than a depth of the limiting groove 12 in the depth direction of the slot 11. A limiting space is defined between two adjacent limiting blocks, and between a slot wall 112 of the slot 11 and the limiting block. For one limiting space at a middle portion of the slot 11, the limiting space is defined by two adjacent limiting blocks and two opposite slot walls 113 and 115. For one limiting space at an end portion of the slot 11, the limiting space is defined by one limiting block adjacent to the end portion of the slot 11 and three adjacent slot walls 112, 113 and 115.

In some embodiments of the present disclosure, the rim 1 further includes a second surface 26. The first surface 20 and the second surface 26 are two opposite surfaces of the rim 1.

One portion of the slot bottom 110 of the slot 11 is depressed in a direction towards the second surface 26 to define the limiting groove 12. The limiting groove 12 extends along a direction that is perpendicular to an extension direction (which is parallel to a direction indicated by an arrow A1 shown in FIG. 2 and FIG. 3) of the slot 11, and extends through two opposite sides of the slot 11 in a direction indicated by an arrow A2 shown in FIG. 2.

In some embodiments of the present disclosure, the mask body includes several mask strips 4 each with an opening pattern. The connector 2 may be a connecting block that is snapped in the slot 11. A thickness of the connecting block in the depth direction of the slot 11 is greater than a depth of the slot 11, thereby facilitating assembling the connector 2 with the mask strip 4 in the slot 11.

In some embodiments of the present disclosure, the connecting block has a first connecting surface 21 for mounting the end portion 41 of the mask strip 4. The first connecting surface 21 is located at an outside of the slot 11. The mask strip 4 is fixed to the first connecting surface 21 by means of welding.

Figure 5:
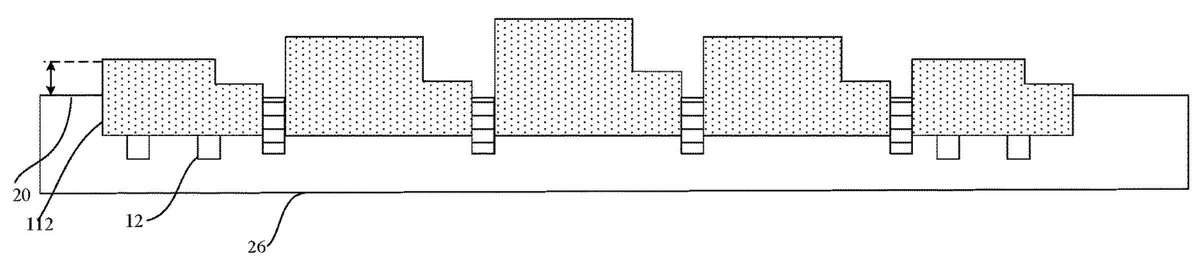
FIG. 5 is a schematic view showing a mask plate frame assembled with a mask plate according to some embodiments of the present disclosure.

In some embodiments of the present disclosure, the first connecting surface 21 of the connecting block has a first height H1 relative to the first surface 20 in a direction perpendicular to the first surface 20. As shown in FIG. 5, along the length direction of the rim 1, the first height of the connecting block is gradually reduced from a middle of the rim 2 towards two ends of the rim 1.

In the related art, after the mask strip is welded to the surface of the frame, the mask strip mask strip contracts inward and then tension is applied to the surface of the frame. Due to the tension, edges of the frame is easily curled and deformed, which may result in that the mask plate cannot be attached to a glass substrate in a proper manner during evaporation, resulting in poor color mixing during evaporation. In one embodiment of the present disclosure, the deformation of the mask plate frame can be compensated by changes in the first height of the connecting block, thereby reducing occurrence of poor color mixing and then improving the product yield.

In some embodiments of the present disclosure, in order to prevent evaporated material from leaking through a gap between adjacent two mask strips, the mask body may further include a shielding strip 5 for shielding the gap between adjacent two mask strips 4. The connecting block has a second connecting surface 22 for mounting the shielding strip 5 of the mask plate.

The first connecting surface 21 of the connecting block has the first height H1 relative to the first surface 20 in the direction perpendicular to the first surface 20. The second connecting surface 22 of the connecting block has a second height H2 relative to the first surface 20 in the direction perpendicular to the first surface 20. The first height H1 is greater than the second height H2.

In order to effectively shield the gap between adjacent two mask strips 4, as shown in FIG. 4, edges of the shielding strip 5 overlap with edges of adjacent two mask strips 4 in the direction perpendicular to the first surface 20. Accordingly, in order to facilitate mounting of the shielding strip 5 and the mask strip 4, the first connecting surface 21 for mounting the mask strip 4 and the second connecting surface 22 for mounting the shielding strip 5 are at different planes. Further, in order to not affect utilization of the mask plate, the first height H1 is greater than the second height H2. In other words, after the mask strip 4 and the shielding strip 5 are mounted to the connecting block, the mask strip 4 is located above the shielding strip 5, as shown in FIG. 4.

One embodiment of the present disclosure further provides a mask plate. The mask plate includes a mask body and the above mask plate frame. The mask body includes several mask strips 4. Two ends of the mask strip 4 are fixed mounted to two opposite rims 1 of the mask plate frame by means of the connectors 2, respectively.

The presence of the connector 2 enables the end portion 41 of the mask strip 4 in the second direction A2 to be detachably mounted to the rim 1 by means of the connector 2. Thus, when replacing the mask strip 4, it is only needed to remove the connector 2 away from the rim 1, without performing operations that damage the rim, such as polishing the surface of the rim 1, thereby extending the service life of the mask plate frame.

In some embodiments of the present disclosure, the mask body may further include a shielding strip 5 disposed between adjacent two mask strips 4. Edges of the shielding strip 5 overlap with edges of adjacent two mask strips 4 in the direction perpendicular to the first surface 20.

In some embodiments of the present disclosure, the presence of the shielding strip 5 can prevent evaporated material from leaking through a gap between adjacent two mask strips 4. Further, in order to effectively shield the gap between adjacent two mask strips 4, the edges of the shielding strip 5 overlap with edges of adjacent two mask strips 4 in the direction perpendicular to the first surface 20. Accordingly, in order to facilitate mounting of the shielding strip 5 and the mask strip 4, the first connecting surface 21 for mounting the mask strip 4 and the second connecting surface 22 for mounting the shielding strip 5 are at different planes. Further, in order to not affect utilization of the mask plate, the first height H1 is greater than the second height H2. In other words, after the mask strip 4 and the shielding strip 5 are mounted to the connecting block, the mask strip 4 is located above the shielding strip 5, as shown in FIG. 4.

One embodiment of the present disclosure further provides an evaporation apparatus that includes the above mask plate.

The presence of the connector 2 enables the end portion 41 of the mask strip 4 in the second direction A2 to be detachably mounted to the rim 1 by means of the connector 2. Thus, when replacing the mask strip 4, it is only needed to remove the connector 2 away from the rim 1, without performing operations that damage the rim, such as polishing the surface of the rim 1, thereby extending the service life of the mask plate frame.

In one embodiment of the present disclosure, the deformation of the mask plate frame can be compensated by changes in the first height H1 of the connecting block, thereby reducing occurrence of poor color mixing and then improving the product yield.

In some embodiments of the present disclosure, in order to prevent evaporated material from leaking through a gap between adjacent two mask strips 4, the mask body may further include a shielding strip 5 for shielding the gap between adjacent two mask strips 4. Further, in order to effectively shield the gap between adjacent two mask strips 4, the edges of the shielding strip 5 overlap with edges of adjacent two mask strips 4 in the direction perpendicular to the first surface 20. Accordingly, in order to facilitate mounting of the shielding strip 5 and the mask strip 4, the first connecting surface 21 for mounting the mask strip 4 and the second connecting surface 22 for mounting the shielding strip 5 are at different planes. Further, in order to not affect utilization of the mask plate, the first height H1 is greater than the second height H2. In other words, after the mask strip 4 and the shielding strip 5 are mounted to the connecting block, the mask strip 4 is located above the shielding strip 5, as shown in FIG. 4.

The above are merely the optional embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A mask plate frame comprising:

two opposite rims; and a plurality of connectors detachably mounted to a first surface of each rim along a length direction of each rim;

wherein each connector is configured to mount a mask strip;

wherein each rim includes a slot defined in the first surface of each rim; the connectors mounted to each rim are snapped in the slot of each rim;

wherein each connector mounted to each rim is a connecting block that is snapped in the slot of each rim; a thickness of the connecting block in the depth direction of the slot of each rim is greater than a depth of the slot of each rim;

wherein the connecting block has a first connecting surface for mounting the mask strip; the first connecting surface has a first height relative to the first surface of each rim in a direction perpendicular to the first surface of each rim; along the length direction of each rim, the first heights of the connecting blocks of the plurality of connectors are gradually reduced from a middle of each rim towards two ends of each rim.

2. The mask plate frame of claim 1, wherein the slot of each rim is a strip slot that extends along the length direction of each rim;

each rim further includes a plurality of stoppers; each of the stoppers of each rim is detachably mounted to one position selected from different positions of the slot of each rim along the length direction of each frame; and the stoppers of each rim limit positions of the connectors mounted to each rim in the length direction of each rim.

3. The mask plate frame of claim 2, wherein each rim further includes a plurality of limiting grooves defined in the slot of each rim, and the limiting grooves are arranged along the length direction of each rim and are spaced from each other;

each stopper includes a limiting block that is detachably mounted to one limiting groove selected from the limiting grooves of each rim;

a thickness of the limiting block of each stopper in a depth direction of the slot of each rim is greater than a depth of the slot of each rim; and a limiting space is defined between every adjacent two limiting blocks and between a slot wall of the slot of each rim and the limiting block adjacent the slot wall.

4. The mask plate frame of claim 3, wherein each rim further includes a second surface, and the first surface and the second surface are two opposite surfaces of each rim;

one portion of a slot bottom of the slot of each rim is depressed in a direction towards the second surface of each rim to define one limiting groove of each rim; and each limiting groove of each rim extends through two opposite sides of the slot of each rim.

5. The mask plate frame of claim 1, wherein the connecting block has a second connecting surface for mounting a shielding strip; the second connecting surface has a second height relative to the first surface of each rim in the direction perpendicular to the first surface of each rim; and the first height is greater than the second height.

6. The mask plate frame of claim 3, wherein each limiting block has a first portion located in one of the plurality of limiting grooves, and a second portion that extends from the first portion; the second portion is located in the slot of each rim; a limiting space is defined between two adjacent second portions of two adjacent limiting block; and one of the plurality of connectors is in the limiting space.

7. A mask plate comprising:

a mask body including a plurality of mask strips; and a mask plate frame;

wherein the mask plate frame includes two opposite rims, and a plurality of connectors detachably mounted to a first surface of each rim along a length direction of each rim; and wherein one end of each strip is mounted to one of the connectors mounted to one of the two rims, and the other end of each strip is mounted to one of the connectors mounted to the other one of the two rims;

wherein each rim includes a slot defined in the first surface of each rim; the connectors mounted to each rim are snapped in the slot of each rim;

wherein each connector mounted to each rim is a connecting block that is snapped in the slot of each rim; a thickness of the connecting block in the depth direction of the slot of each rim is greater than a depth of the slot of each rim;

wherein the connecting block has a first connecting surface for mounting the mask strip; the first connecting surface has a first height relative to the first surface of each rim in a direction perpendicular to the first surface of each rim; along the length direction of each rim, the first heights of the connecting blocks of the plurality of connectors are gradually reduced from a middle of each rim towards two ends of each rim.

8. The mask plate of claim 7, wherein the mask body further includes a shielding strip disposed between adjacent two mask strips; and edges of the shielding strip overlap with edges of adjacent two mask strips in the direction perpendicular to the first surface.

9. The mask plate of claim 7, wherein the slot of each rim is a strip slot that extends along the length direction of each rim;

each rim further includes a plurality of stoppers; each of the stoppers of each rim is detachably mounted to one position selected from different positions of the slot of each rim along the length direction of each frame;

the stoppers of each rim limit positions of the connectors mounted to each rim in the length direction of each rim.

10. The mask plate of claim 9, wherein each rim further includes a plurality of limiting grooves defined in the slot of each rim, and the limiting grooves are arranged along the length direction of each rim and are spaced from each other;

each stopper includes a limiting block that is detachably mounted to one limiting groove selected from the limiting grooves of each rim;

a thickness of the limiting block of each stopper in a depth direction of the slot of each rim is greater than a depth of the slot of each rim; and a limiting space is defined between every adjacent two limiting blocks and between a slot wall of the slot of each rim and the limiting block adjacent the slot wall.

11. The mask plate of claim 10, wherein each rim further includes a second surface, and the first surface and the second surface are two opposite surfaces of each rim;

one portion of a slot bottom of the slot of each rim is depressed in a direction towards the second surface of each rim to define one limiting groove of each rim; and each limiting groove of each rim extends through two opposite sides of the slot of each rim.

12. The mask plate of claim 10, wherein each limiting block has a first portion located in one of the plurality of limiting grooves, and a second portion that extends from the first portion; the second portion is located in the slot of each rim; a limiting space is defined between two adjacent second portions of two adjacent limiting block; and one of the plurality of connectors is in the limiting space.

13. The mask plate of claim 7, wherein the connecting block has a second connecting surface for mounting a shielding strip; the second connecting surface has a second height relative to the first surface of each rim in the direction perpendicular to the first surface of each rim; and the first height is greater than the second height.

14. The mask plate of claim 7, wherein one end of each strip is welded to one of the connectors mounted to one of the two rims, and the other end of each strip is welded to one of the connectors mounted to the other one of the two rims.

15. An evaporation apparatus comprising the mask plate of claim 7.

* * * * *